(12) United States Patent
Klabunde et al.

(10) Patent No.: US 8,818,761 B2
(45) Date of Patent: Aug. 26, 2014

(54) DEVICE AND METHOD FOR OFFSET COMPENSATION BASED ON HYSTERESIS TRACKING

(75) Inventors: Boris Klabunde, Hamburg (DE); Stefan Butzmann, Beilstein (DE)

(73) Assignee: NXP B.V., Eindhoven (NL)

( * ) Notice: Subject to any disclaimer, the term of this patent is extended or adjusted under 35 U.S.C. 154(b) by 420 days.

(21) Appl. No.: 13/059,476

(22) PCT Filed: Aug. 21, 2009

(86) PCT No.: PCT/IB2009/053693
§ 371 (c)(1),
(2), (4) Date: Apr. 28, 2011

(87) PCT Pub. No.: WO2010/020965
PCT Pub. Date: Feb. 25, 2010

(65) Prior Publication Data
US 2011/0202315 A1 Aug. 18, 2011

(51) Int. Cl.
*G06F 15/00* (2006.01)
*H03M 7/12* (2006.01)

(52) U.S. Cl.
USPC .......................................... 702/189; 333/172

(58) Field of Classification Search
CPC ........... H02M 3/18; H03M 3/00; H03M 1/12; H03M 1/06; H04K 5/159; H03H 7/30; H03H 7/40; G06F 15/00; G01P 3/42
USPC .............................. 327/205; 702/189; 333/172
See application file for complete search history.

(56) References Cited

U.S. PATENT DOCUMENTS

| | | | |
|---|---|---|---|
| 4,251,785 A | 2/1981 | Pfleiderer | |
| 4,922,126 A | 5/1990 | Lowel | |
| 5,359,287 A | 10/1994 | Watanabe et al. | |
| 7,231,325 B2* | 6/2007 | Motz et al. | 702/189 |
| 2002/0009000 A1* | 1/2002 | Goldberg et al. | 365/200 |
| 2002/0030617 A1* | 3/2002 | Haroun et al. | 341/143 |
| 2007/0080683 A1 | 4/2007 | Bartos et al. | |
| 2008/0177499 A1* | 7/2008 | Maone et al. | 702/147 |
| 2009/0002066 A1* | 1/2009 | Lee et al. | 327/554 |

FOREIGN PATENT DOCUMENTS

| | | |
|---|---|---|
| EP | 0658381 A1 | 3/1990 |
| GB | 2295512 A | 5/1996 |
| JP | 2008039583 A | 2/2008 |
| WO | 02071621 A2 | 9/2002 |
| WO | 2005075943 A1 | 8/2005 |
| WO | 2005076016 A1 | 8/2005 |

OTHER PUBLICATIONS

Luck, J. et al.; "First-Order, Switched-Capacitor, Low-Pass filter implemented with GAAS Insulated-Gate FET Switches"; Electronics Letters, IEEE Stevenage, GB vol. 26, No. 22; pp. 1843-1845; Oct. 25, 1990.
Feng Chen, et al.; "A 0.25-mW Low-Pass Passive Sigma-Delta Modulator with Build-In Mixer for a 10-MHz IF Input"; IEEE Journal of Solid-State Circuits, IEEE Service Center; vol. 32, No. 6; Jun. 1, 1997.
International Search Report and Written Opinion, PCT/IB/051714, Jun. 30, 2009.

\* cited by examiner

*Primary Examiner* — John Breene
*Assistant Examiner* — Ruihua Zhang

(57) ABSTRACT

A signal processor for removing at least one unintended signal component from an input signal (ua) is proposed. The signal processor includes a filter device (130) and a processing device (150). The filter device (130) filters the input signal ($u_{\hat{a}}$) and generates a filtered signal ($u_f$), which includes the unintended signal component to be removed. The processing device (150) generates an output signal ($u_m$), which indicates a deviation of the input signal (ua) from the filtered input signal ($u_f$). By detecting the unintended signal component first an removing this component from the input signal ($u_{\hat{a}}$), the input signal will not be manipulated directly but the unintended signal component in the input signal ($u_{\hat{a}}$) will be compensated. This allows to remove the unintended component from the input signal ($u_{\hat{a}}$) with less distortions of the interesting components in the input signal ($u_{\hat{a}}$).

15 Claims, 6 Drawing Sheets

DEVICE AND METHOD FOR OFFSET COMPENSATION BASED ON HYSTERESIS TRACKING

FIELD OF THE INVENTION

The invention relates to a filter device for filtering an input signal and to an apparatus for removing a filtered input signal from an input signal, to a sensor apparatus adapted to output an offset free measurement signal and to a method for removing a filtered input signal from an input signal.

BACKGROUND OF THE INVENTION

Measurement engineering is a science dealing with sensor apparatuses for sensing a physical value and converting the sensed physical value into an electronic measurement signal, which can be used for further signal processing.

Such a sensing apparatus usually includes a sensing device and a preprocessing device.

The sensing device is named sensor head. It measures the physical value and converts the measured physical value into an electronic sensor signal. This sensor signal is usually weak and includes a lot of unintended signal components like noise components and an offset component. These unintended components make a direct signal processing with the sensor signal unsuitable.

To prepare the sensor signal for further signal processing, the preprocessing device generates the measurement signal including only signal components of the sensor signal having information about the measured physical value. For simplification, these signal components should be named interesting components. The preprocessing device thus removes the unintended components of the sensor signal and amplifies the interesting components.

For removing the unintended components, different approaches have been proposed. The common idea of all of these solutions is to determine the unintended components and to remove these determined components by special filters. Two different examples should illustrate the procedure. The offset component may be determined by superimposing the sensor signal with a sensor signal being shifted by a shifting angle of 180 degrees. The determined offset component can then be subtracted from the sensor signal to generate the measurement signal. However, the shifting angle is technically realized by a time delay, which is subjected to technical errors. Due to these technical errors, not only the offset component will be removed but the interesting components will also be distorted.

Alternatively, a high pass filter may be applied to remove the offset component. Although the high pass filter removes the offset, it also distorts the sensor signal around 0 Hz, since there exist no high pass filter having an ideal cut-off frequency for removing only signal components having 0 Hz.

As can be seen from the forgoing example, when removing unintended signal components from the sensor signal, the remaining interesting signal components would forcibly be distorted. This increases the measurement error of the measured physical value and complicates the whole signal procession of the measurement signal output by the sensing apparatus.

To attenuate the effects of the distortions of the interesting signal components of the sensor signal, further technical means must be provided. However, these technical means would counteract another important technical requirement of the sensing apparatus—the limited space for its implementation. Modern electronic devices tend toward miniaturization, such that available space for sensing apparatuses as described above becomes smaller. This trend does not allow providing a complex preprocessing device for attenuating negative effects, which artificially occur due to the technical implementation of the sensing apparatus. In other words, it would be better to avoid distortions of the interesting components than to process the distorted interesting components afterwards.

OBJECT AND SUMMARY OF THE INVENTION

It is therefore an object of the invention to provide an electronic filter, a signal processor, a sensing apparatus and a method for filtering an input signal allowing to reduce the space for the technical implementation.

The object is solved by the features of the independent claims. Further embodiments are subject of the dependent claims.

The invention is based on the thought, that most of the technical space may be saved by the technical implementation of the electronic filter detecting the unintended signal components of the sensor signal. Conventionally, these filters are provided as a combination of energy storage elements and ohmic resistors. The energy storage element functions as memory element, which is required to analyze the sensor signal over a predetermined period of time. They are realized preferably as capacitors. The ohmic resistor is required to define a time window during which the sensor signal should be analyzed to detect the unintended components. The invention proposes such a filter allowing not only to omit the ohmic resistor but also to reduce the size required for the energy storage element. This is achieved by at least one switching element, which is adapted to connect and break a connection between at least two energy storage elements. The invention works best, if the amount of used energy storage elements is higher than two.

Thus, the invention provides a filter for filtering an input signal including a first energy storage element receiving the input signal and a second energy storage element outputting the filtered output signal. Both storage elements are connected via a switching circuit, which is adapted to enable and disable a connection between the first and second storage element. Since the switching circuit enables and disables the connection between the two storage elements, it artificially generates an ohmic resistance. In other words, due to the switching circuit, the ohmic resistance in the filter may be omitted. Thus, the space required for implementing the filter element can be reduced drastically. Further, the switching circuit allows switching the capacity of the energy storage element within predetermined values. Preferably, the energy elements may be capacitors to e.g. realize a high-pass filter if the capacitors are connected in series or to realize a low pass filters if the capacitors are connected in parallel.

In case of the low pass filter, when the capacitors are connected in parallel, the switching circuit may be adapted to disable and enable both connection lines between the capacitors, to e.g. prevent charging of one of the capacitors during the disconnection.

The filter may further comprise a control device for forcing the switching circuit to periodically enable and disable the connection between the storage elements with a predetermined frequency. By this periodical switching, the ohmic resistance can be merely controlled via the predetermined frequency.

The invention is further based on the thought, that a manipulation of an input signal always leads to unintended distortions. Thus, when processing the input signal for removing unintended signal components, it is more suitable to generate a completely new signal as a processed input signal instead of merely canceling out the unintended signal components.

Therefore, the invention further proposes a signal processor for removing an unintended signal component from an input signal. The signal processor includes a filter device and a processing device. The filter device generates a filtered signal of the input signal including the unintended signal component. The processing device verifies this filtered signal with the input signal and generates an output signal indicating a deviation of the input signal from the filtered signal. By generating a completely new signal as output signal being e.g. the sensor signal with removed unintended signal components, distortions of the interesting components in the output signal are prevented. This avoids an additional signal processing after removing the unintended signal components from the input signal. Thus, the signal processor according to the present invention not only provides a clear signal including only interesting signal components but also saves spaces for the implementation, since further complex signal processing means may be omitted.

The filter device may be a filter device including two energy storage elements connected with a switching circuit as described before. Such an embodiment would further reduce the required space for implementing the filter device.

Preferably, the filter device may be a low pass filter. By detecting only low frequency components of the input signal, the filter device is able to detect offset components of the input signal. In other words, the low pass filter is able to reference the DC-level of the input signal. This DC-level can be taken into account when generating the output signal. Since the low pass filter is able to nearly exactly determine the DC-level, other frequency components of the input signal around 0 Hz will not be affected. Thus, when using a low pass filter as filter device, the present invention improves capability to remove an offset component from an input signal without distorting other signal components around 0 Hz.

The filter device may be adapted to determine an average value of the input signal during a time window. This time window allows specifying the quality and the speed of the effect of the signal processor. If the time window is chosen shortly, the average value of the input signal may be defined quickly, but with large tolerances. In contrary thereto, a secure value for the average value may be defined with a long time window. This, however, lead to a delay in the effects of the signal processor. More specifically, if a long time window is utilized, the time for receiving an offset free output increases.

To combine the advantages of a short time window and a long time window, it is proposed to utilize a short time window at the operational start of the signal processor and to increase the duration of the time window during the operation of the signal processor until a suitable length for the time window has been reached. By combining both types of time windows, it is possible to achieve immediately results at the operational start of the signal processor, but to also improve the quality of the operation of the signal processor during the operation in the steady state of the signal processor.

Preferably, the control of the length of the time window is performed by a control device to achieve a reliable and exact control operation.

The transition between the long time window and the short time window may be continuously or discrete. A discrete transition should be preferred, since this transition may be controlled by a usual state machine.

In a further improvement, the processing device is adapted to generate at least two hysteresis levels. An upper hysteresis level is higher or equal the filtered input signal and a lower hysteresis level is lower or equal the filtered input signal. The hysteresis levels are very suitable to consider further unintended signal components in the input signal like noise. Preferably, the processing device indicates a deviation between the upper hysteresis level and the filtered input signal if the filtered input signal exceeds the upper hysteresis level. The processing device may further indicate a deviation between the lower hysteresis level and the filtered input signal if the filtered input signal falls below the lower hysteresis level. By that means, electronic or mechanical noise effects may be filtered in an effective way.

A distance between the upper and lower hysteresis level may be adjustable by a control device based on the requirements to the quality of the output signal or based on received the quality of the input signal. This e.g. allows to filter out strong noise components by setting a high distance. However, by setting a high distance also interested components of the input signal may be lost, such that in case of a good quality of the input signal, the distance between the upper and lower hysteresis level may be reduced. In other words, the distance between the upper and lower hysteresis level provides effective means for increasing the tolerance of the control device against noise or other unintended signal components.

The deviation of the upper hysteresis level and the filtered input signal may be indicated as a constant positive signal level independently from the amount of the deviation. Synchronously, the deviation of the lower hysteresis level and the filtered input signal may be indicated as constant negative signal level independently from the amount of the deviation. By that means, the signal processor outputs a clear and easily interpretable output signal, in which only the frequency of the output signal includes information about the interesting signal components.

If the filtered input signal is situated between the upper and lower hysteresis level, the signal processor may keep its output unaltered. However, in this case, it is preferred, that the processing device keeps constant the upper and lower hysteresis level to prevent a situation in which the input signal never crosses one of the hysteresis levels. In other words, by keeping the upper and lower hysteresis level constant, it is prevented that the input signal is always situated between the upper and lower hysteresis level, since it is pre-assumed that the input signal always includes at least one alternating component. The signal processor as described above can be applied best in a sensing apparatus. Such sensing apparatus further includes a sensor head generating a sensor signal including information about a measured physical value. Therein, the signal processor receives the sensor signal as input signal and removes an offset from the sensor signal as described above. Since the processing device can be constructed with less space, the same advantageous effects are also valid for the complete sensing apparatus.

The sensing apparatus may preferably an anisotropic magneto resistive sensor, or AMR-sensor, since these sensors always produce an offset component during its operation, such that the signal processor according to the present invention can remove the offset component from the sensor signal without destroying important information about a position measured by the AMR-sensor.

The sensing apparatus may further include an amplifier to amplify the sensor signal prior providing to the processing device. This is especially suitable for sensor signals being to week for further signal processing.

The best way to perform the invention is to make a distance between an upper and lower hysteresis level dependent on the amplification factor of the amplifier. Since the amplifier not only amplifies the interesting signal components of the sensor signal but also noise and other unintended signal components, the adjustment of the distance of the hysteresis levels effectively reacts to the operational pre-requirements of the overall sensing apparatus.

The amplifier may be an automatic gain control, or AGC amplifying the sensor signal based on the output signal, to keep the level of the output signal constant. Since the invention provides an offset free output signal, the amplification factor determined by the AGC merely relates the alternating signal components including the information about the measured physical value.

In a method for removing a constant component from an input signal, an energy storage will be charged with an input signal. This charging state will be compared with the input signal itself. Finally, an output signal will be generated indicating a deviation of the input signal from the charging state.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
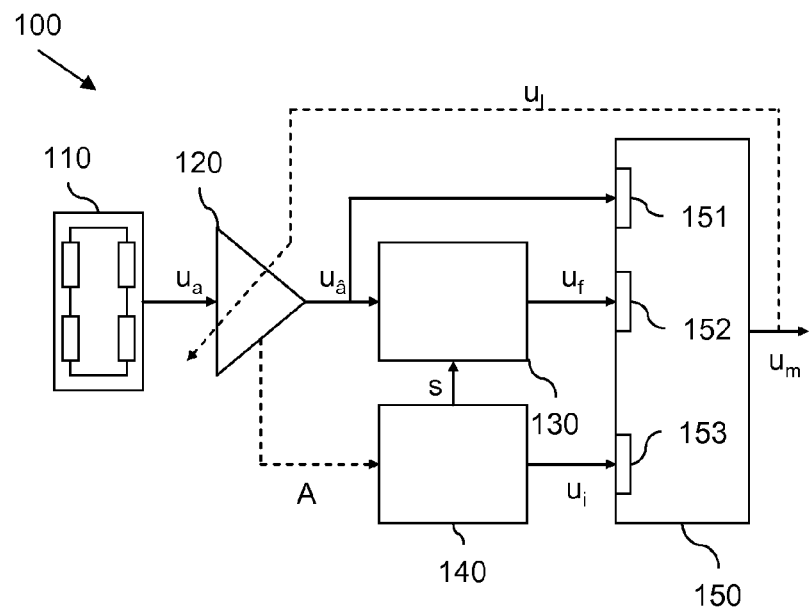
FIG. 1 is a structural view of a sensing apparatus according to the invention.

FIG. 1 is a structural view of a sensing apparatus 100 according to the invention. The sensing apparatus includes a sensor head 110, a variable amplifier 120, an electronic filter 130, a controller 140 and a comparator 150.

The sensor head 110 is an electronic component, which measures a physical value and converts the measured physical value into a sensor signal $u_a$. The sensor signal $u_a$ includes signal components having a shape dependent on the measured physical value. These signal components are called interesting components, since the measured physical value can be derived from their shape. Modern electronic applications including such kind of a sensing apparatus 100 directly use the sensing signal $u_a$ for further tasks like a control operation of an electronic device based on the measured physical value. The sensor signal $u_a$ further includes unintended components. These components occur e.g. due to perturbations or due to the supply of the sensor head 110 with electrical energy and complicate an automatic signal processing.

Perturbations can be mainly divided into electronic noise and mechanical measurement errors. Electronic noise is an unspecified electronic fluctuation in the sensor signal $u_a$. The most popular kind of electronic noise is white Gaussian noise. Mechanical measurement errors occur due to mechanical influences onto the sensor head 110. If e.g. the sensor head is used for measuring a position, and the sensor head is vibrating, the sensor signal $u_a$ will include a further signal component indicating the vibration, since from the physical point of view, vibration is also a position information. However, this further signal component does not include any information about the intended physical value to be measured. Summarized, perturbations deform the shape of the interesting components and make a derivation of the information about the measured physical value from the interesting components difficult.

The second class of unintended components occurs due to supplying the sensor head 110 with electronic energy. Such an unintended component is usually a signal offset, since most of the sensor heads 110 are supplied with a direct current. However, as shown later, the sensor signal $u_a$ is usually to weak for a direct signal procession and requires an amplification. The required amplification factor can be determined based on the signal strength of the sensor signal $u_a$. If the sensor signal however included an offset, the required amplification factor can not be determined correctly and the interesting components in the sensor signal keeps to weak for a correct interpretation of the measured physical value.

The amplification of the sensor signal $u_a$ is performed by the amplifier 120 and can be omitted, if the sensor signal $u_a$ is strong enough for further signal procession. Therefore, the amplifier 120 receives the sensor signal $u_a$ and outputs an amplified sensor signal $u_{\ddot{a}}$. The amplification factor A may be predetermined or can be set based on an output signal $u_m$ of the sensing apparatus 100. In a preferred embodiment, the amplifier 120 can also provide the used amplification factor A to the controller 140 for further signal procession as described later.

The amplified sensor signal $u_{\ddot{a}}$ can be directly provided to the comparator 150. Further, the amplified sensor signal $u_{\ddot{a}}$ can be provided to the electronic filter 130. The electronic filter 130 can filter a predetermined signal component from the amplified sensor signal $u_{\ddot{a}}$ based on predetermined settings. This predetermined signal component shall be an unintended component to be removed from the amplified sensor signal $u_{\ddot{a}}$. Without any limiting purpose, the unintended component should be an offset component $u_f$ in the following. Thus, the electronic filter 130 filters the offset component $u_f$ from the amplified sensor signal $u_{\ddot{a}}$. Therewith, the electronic filter 130 needs to be a low-pass filter and should therefore be named low-pass filter 130 in the following. A detailed description about the operation of the low-pass filter 130 will be provided later. The low-pass filter 130 may be controlled by a setting signal s.

In the present embodiment, the setting signal s is provided from the controller 140. In other words, the controller 140 is adapted to control the operation of the low-pass filter 130 with the setting signal s. The controller 140 can optionally also control the operation of the comparator 150. A detailed explanation of the operation of the controller 140 will be provided later together with the explanation of the low-pass filter 130.

The comparator 150 requires at least two ports. A sensor port 151 is adapted to receive the amplified sensor signal $u_{\ddot{a}}$. The second required port is a filter port 152 for receiving the offset component $u_f$ to be removed from the amplified sensor signal $u_{\ddot{a}}$. A hysteresis port 153 as third input port may be provided, which will be described later. The comparator 150 verifies the signals $u_ä$, $u_f$ received via the sensor port 151 and the filter port 152 and outputs a deviation of the amplified sensor signal $u_ä$ from the offset component $u_f$. This deviation is included into the output signal of the sensing apparatus 100, which is named measurement signal $u_m$.

The deviation may be included into the measurement signal $u_m$ by its correct distance between the amplified sensor signal $u_ä$ and the offset component $u_f$. Another possibility is to discretely include the deviation into the measurement signal $u_m$ only by the sign of the distance between the sensor signal $u_ä$ and the offset component $u_f$. The technical implementation depends on the requirements onto the measurement signal $u_m$ mainly defined by devices processing the measurement signal $u_m$ after the sensing apparatus 100. In the following, it should be assumed, that the measurement signal only indicates, whether the amplified sensor signal $u_ä$ deviates positively or negatively from the offset component $u_f$. Summarized, the sensing apparatus 100 according to the present invention detects a physical value and converts the physical value into a sensing signal $u_a$. Next, the sensing apparatus 100 filters the sensing signal $u_a$, which may be preferably amplified in advance. The filtered sensing signal $u_a$ may be the offset component $u_f$ of the sensor signal $u_a$. Finally, the sensing apparatus 100 compares both signals $u_f$, $u_a$ against each other and creates the measurement signal $u_m$, based on the deviation of the sensing signal $u_a$ from the offset component $u_f$.

In the following, the technical implementation of the low-pass filter 130 for determining the offset component $u_f$ should be discussed in further detail.

Figure 2:
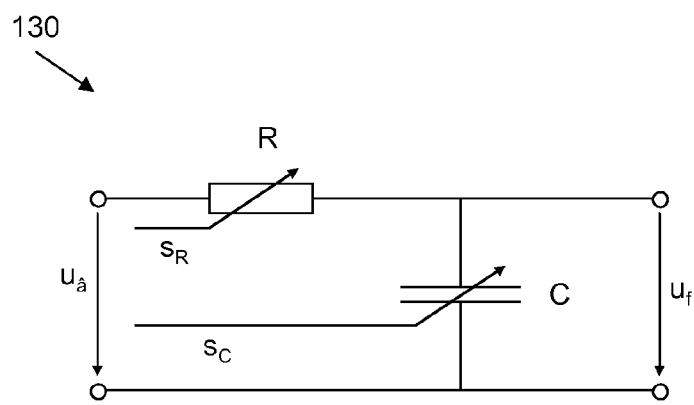
FIG. 2 is a diagram showing the working principle of a first embodiment of a comparator according to the invention.

FIG. 2 shows a structural view of a first embodiment of the low pass filter 130. Thereafter, the electronic filter 130 includes a variable resistor R and a variable capacitor C. The variable resistor R is connected to the input of the electronic filter 130 in series. The variable capacitor C is connected to the output of the electronic filter 130 in parallel. Thus, the variable resistor R and the variable capacitor C are arranged to form a well known low-pass filter.

The resistance of the variable resistor R can be adjusted by a resistor setting signal $s_R$. The capacitance of the variable capacitor C can be adjusted by a capacitor setting signal $s_C$. Thus, the time constant $\tau=RC$ of the low-pass filter 130 according to the first embodiment can be adjusted by amending the resistance of the resistor R and/or by amending the capacitance of the capacitor C. Due to practical reasons, only the capacitance of the capacitor C may be adjustable and the resistance of the resistor R may be kept constant.

The low-pass filter 130 receives the amplified sensor signal $u_ä$ and outputs the offset component $u_f$ of the sensor signal $u_ä$ by filtering it. As described later, the quality of the offset component $u_f$ output by the low-pass filter 130 is restricted to some physical limits. These restrictions mainly depend on the time constant $\tau$ of the low-pass filter 130. The higher the time constant $\tau$, the more accurate is the offset component $u_f$ of the sensor signal $u_ä$. However, a high time constant $\tau$ increases the response time of the sensor apparatus 100. Thus, as shown later, one of the challenges to the present invention is to provide a sensing apparatus 100 filtering an accurate offset component $u_f$ of the sensor signal $u_ä$ and having a quick response time.

Figure 3:
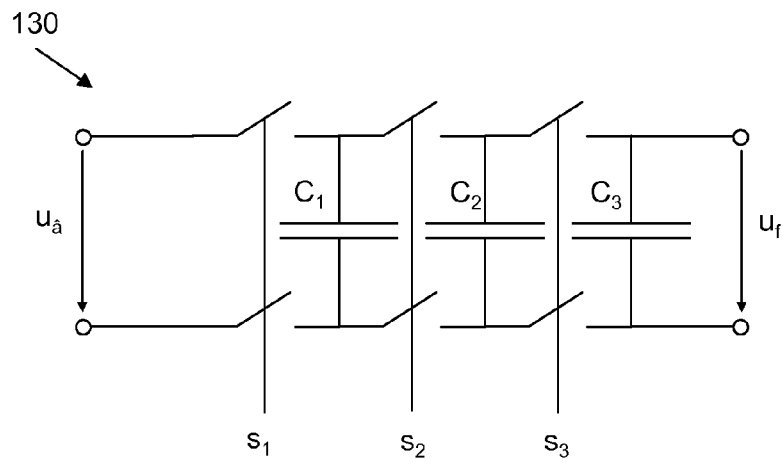
FIG. 3 is a diagram showing an explanation of a Schmitt-Trigger.

Prior regarding this challenge and its solution in further detail, a second embodiment for the electronic filter 130 as shown in FIG. 3 should be discussed.

This low-pass filter 130 may include three capacitors $C_1$-$C_3$ connected in parallel. This amount of capacities is chosen arbitrarily. Each parallel connection of the capacitors $C_1$-$C_3$ can be enabled or disabled by a switch provided in each connection line of the parallel connection. Further, the first capacitor $C_1$ is connected to the input of the low pass filter 130 in parallel. Also the parallel connection between the first capacitor $C_1$ and the input of the low-pass filter 130 can be enabled or disabled by a switch provided in both connection lines of the parallel connection. The third capacitor $C_3$ is connected with the output of the low-pass filter 130 without having any switch for disabling or enabling the parallel connection.

As already mentioned, the amount of three capacitors is chosen arbitrarily. The basic idea behind this embodiment is to connect a plurality of capacitors in parallel, wherein each parallel connection can be enabled or disabled by a switch provided in both connection lines.

The switching state of the switches can be controlled by control signals $s_1$-$s_3$. Therein, each of the switches is controlled in such a way, that the capacitors $C_1$-$C_3$ will be step-wise loaded in periodic loading cycles. Preferably, only one switch will be closed at one point in time. That is, at the beginning of each loading cycle, the switches located prior the first capacitor $C_1$ will be closed first. In the end of each loading cycle, the last switches located prior the third capacitor $C_3$ will be closed at last.

Since all capacitors are connected in parallel to the input and output, the filter 130 operates as low-pass filter. Therein, the time constant $\tau$ can be adjusted by the switching time of each switch. Principally, the switching time can be arbitrarily chosen. However, the best results for the offset component $u_f$ of the amplified sensor signal $u_ä$ have been achieved, when each switch is closed until a steady loading state for the respective capacitor $C_1$-$C_3$ has been achieved. As obviously visible such a switching time would lead to a relatively long time constant $\tau$ for the low-pass filter 130. On the other hand, if the switching cycle will be shortened, the time constant $\tau$ will be decreased, which however leads to a reduced quality for the offset component $u_f$ of the amplified sensor signal $u_ä$.

Turning back to the amount of capacitors $C_1$-$C_3$: The dimensions and number of capacitors depend on the one hand on the expected signal frequencies and magnitudes of the amplified sensor signal $u_ä$ and on the other hand on the structural requirements of the electronic filter. The expected signal frequencies and magnitudes are defined by the sensor head. If the sensor head 110 outputs a sensor signal $u_a$ having interesting signal components with very high frequencies, the low-pass filter 130 may be dimensioned more imprecisely around 0 Hz for filtering the offset component $u_f$. If the sensor head 110 outputs a sensor signal $u_a$ having interesting signal components with very low frequencies, the low-pass filter 130 may be dimensioned very precisely around 0 Hz, in order to not filter any interesting components together with the offset component $u_f$. The structure of the low-pass filter 130 may be influenced by the amount of used capacitors. As for example, comparable results for the electronic filter 130 could be reached with a first structure having only two capacitors and a second structure having four capacitors. In the first structure, the capacity of the first capacitor is 16 times higher than the capacity of the second capacitor. This corresponds to the second structure, when all four capacitors have an identical small capacitance (ratio $1/(2^4)$). The second structure of the low-pass filter 130 including a plurality of identical small capacitors simplifies the technical complexity and makes the low-pass filter 130 more reliable.

Figure 4:
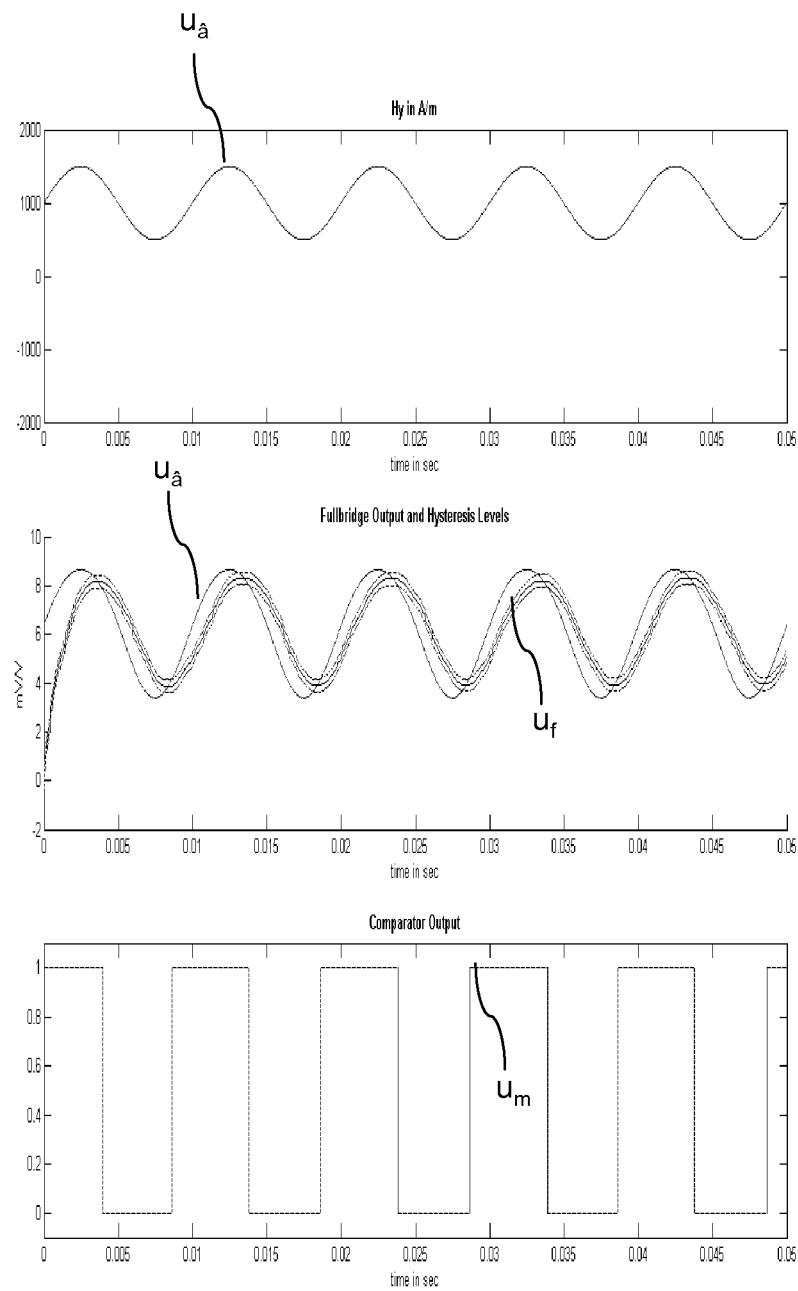
FIG. 4 is a diagram showing the working principle of a second embodiment of a comparator according to the invention.

FIG. 4 discusses the operation of the low-pass filter 130 for a small time constant $\tau$. The figure is divided into three diagrams. The upper diagram shows the chronological sequence of the amplified sensor signal $u_ä$. The diagram in the middle of the figure shows the amplified sensor signal $u_ä$ and the filtered offset component $u_f$ to indicate the crossing points between both signals. The last diagram shows the output signal of the comparator 150.

As can be seen from FIG. 4, the filtered offset component $u_f$ achieves its steady state relatively quickly. That is, small time constant τ for the low-pass filter 130 leads to a short response time for the offset component $u_f$. Since the low-pass filter 130 quickly outputs the offset component $u_f$, the sensor apparatus 100 quickly provides the measurement signal $u_m$.

However, as can be further seen from FIG. 4, the crossing points between the amplified sensor signal $u_ä$ and the filtered offset component $u_f$ are located nearly in the turning points of both signals. This makes an exact determination for the crossing points difficult and increases the measurement error of the comparator 150. In other words, the measurement signal $u_m$ output by the sensor apparatus 100 is very erroneous if the low-pass filter 150 has a low small time constant τ.

To challenge the error of the measurement signal $u_m$, the time constant r of the low-pass filter 130 can be increased. This is discussed in FIG. 5.

Figure 5:
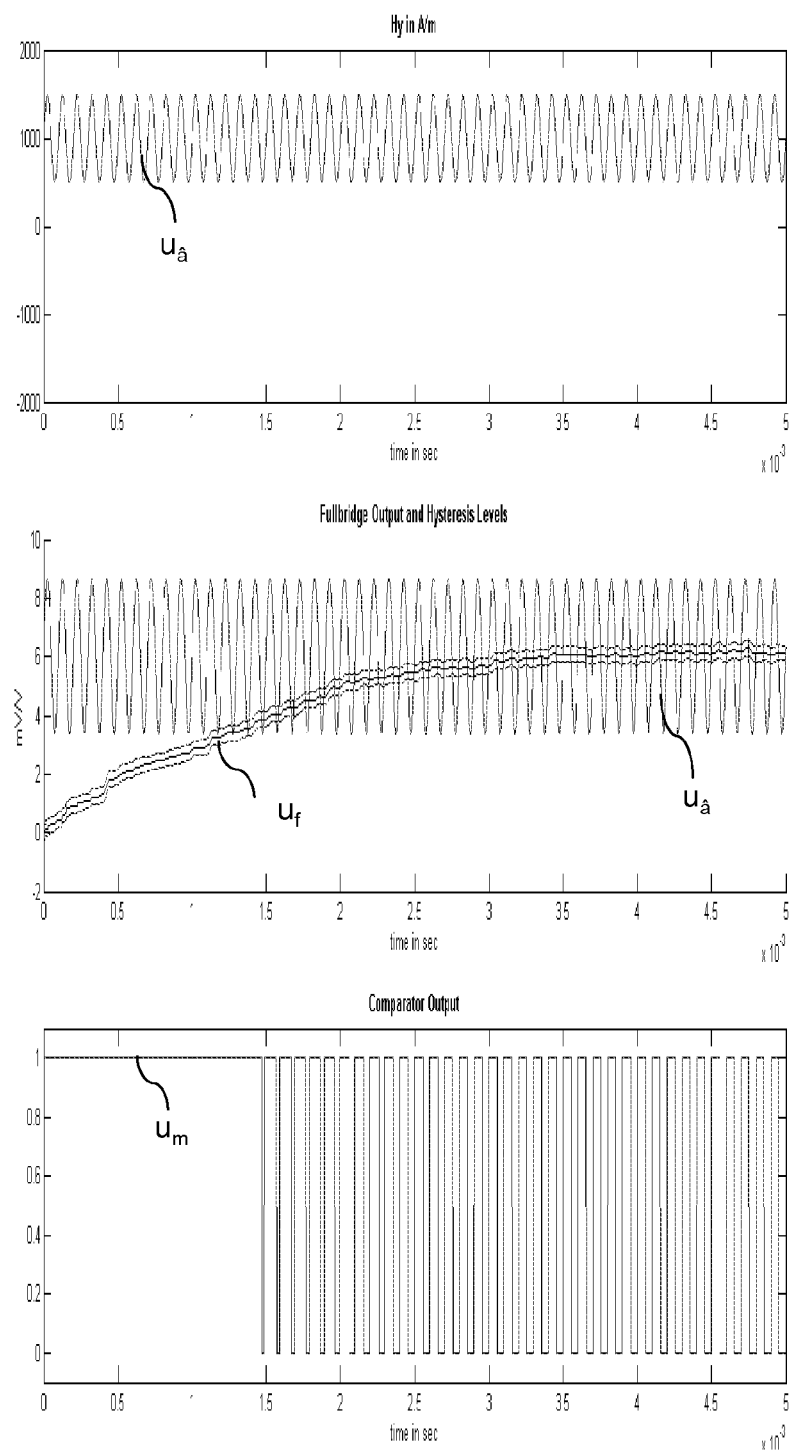
FIG. 5 is a diagram showing the working principle of a third embodiment of a comparator according to the invention.

Synchronously to FIG. 4, FIG. 5 discusses the operation of the low-pass filter 130 for a long time constant τ. The figure is divided into three diagrams. To facilitate the discussion with the long time constant τ, all diagrams in FIG. 5 are crushed compared to the diagrams of FIG. 4. The upper diagram shows the chronological sequence of the amplified sensor signal $u_ä$. The diagram in the middle of the figure shows the amplified sensor signal $u_ä$ and the filtered offset component $u_f$ to indicate the crossing points between both signals. The last diagram shows the output signal of the comparator 150.

As can be seen from FIG. 5, the low-pass filter 130 takes a relatively long time for achieving its steady state and responding the correct offset component $u_f$. The result is a very long time distance until the sensing apparatus 100 responds with the measurement signal $u_m$.

However, the great advantage of the long time constant τ is that the offset component $u_f$ output by the low-pass filter 130 is nearly constant. This results in crossing points between the amplified sensor signal $u_ä$ and the filtered offset component $u_f$, which are located in the inflection points of the amplified sensor signal $u_ä$. Since the slope of the amplified sensor signal $u_ä$ is maximal in the inflection points, the determination of the crossing points is very exact. Since the crossing points can be determined very exactly, the measurement signal $u_m$ is less erroneous.

As can be seen from the foregoing discussion, a long time constant τ leads to an exact measurement signal $u_m$. However, this measurement signal $u_m$ requires a relatively long time for determination. In contrary thereto, a short time constant τ allows a quick determination of the measurement signal $u_m$, which however is very erroneous.

To use the advantages of both kind of time constants τ, the present invention utilizes the controller 140 for amending the time constant r of the low-pass filter 130 over the time. In detail, the controller 140 sets a short time constant τ at the beginning of the operation of the sensing apparatus 100 and increases this time constant τ over the time. This results in a relatively quick response of the sensing apparatus 100, wherein the error of the measurement signal $u_m$ is decreased over the time. As discussed in FIGS. 2 and 3, the controller 140 can amend the time constant τ of the low-pass filter 150 either by amending the capacity and/or the resistance in a conventional low-pass filter or by amending the switching frequency in the low-pass filter according to FIG. 3.

Turning now to the operation of the comparator 150: This operation is not limited to a technical element merely comparing the amplified sensor signal $u_ä$ and the offset component $u_f$ against each other. Since the offset component $u_f$ may principally each unintended component in the amplified sensor signal $u_ä$, the idea according to the invention is to remove an unintended component from the amplified sensor signal $u_ä$, after being determined by a filter element, being the low-pass filter 130 in the detailed description. The removal of the unintended component can therefore also be achieved by other technical elements, like a subtractor or a differential amplifier merely subtracting the unintended component from the amplified sensor signal $u_ä$. Thus, the comparator 150 as described before should be regarded as a technical element derives a deviation between two input signals, namely the amplified sensor signal $u_ä$ and the unintended component.

To illustrate the operation of the comparator 150 in more detail, three different embodiments should be provided in the following. For these explanations, it should be assumed, that the unintended component is the offset component $u_f$, which is determined by the low-pass filter 130 having a short time constant τ.

Figure 6:
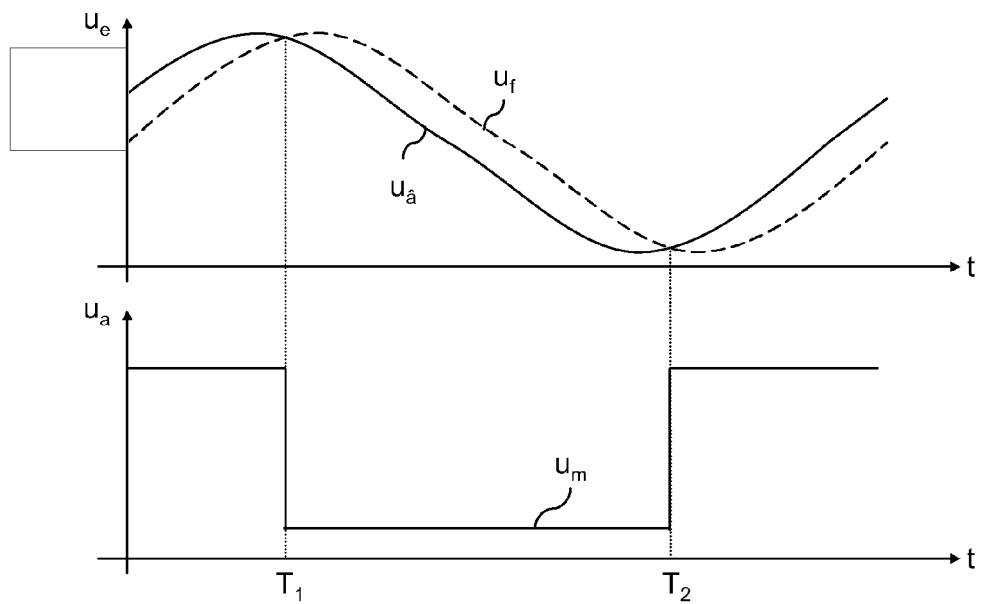
FIG. 6 is a diagram showing the working principle of a fourth embodiment of a comparator according to the invention.

FIG. 6 shows the working principle of a first embodiment of the comparator 150. Therein, two different diagrams are shown. The first diagram shows the input signals of the comparator 150, namely the amplified sensor signal $u_ä$ and the offset component $u_f$. Therefore, this diagram should be named input diagram. The second diagram below the first diagram shows the output signal of the comparator 150, namely the measurement signal $u_m$.

As can be seen from FIG. 6, the amplified sensor signal $u_ä$ crosses the offset component $u_f$ in the points in time $T_1$ and $T_2$. Prior the point in time T1, the amplified sensor signal $u_ä$ exceeds the offset component $u_f$. Between the points in time $T_1$ and $T_2$, the amplified sensor signal $u_ä$ falls below the offset component $u_f$. Finally, after the point in time $T_2$, the amplified sensor signal $u_ä$ again exceeds the offset component $u_f$.

The comparator 150 now merely detects whether the amplified sensor signal $u_ä$ exceeds or falls below the offset component $u_f$ and outputs a rectangular signal based on the verification of both input signals $u_ä$, $u_f$. Namely, if the amplified sensor signal $u_ä$ exceeds the offset component $u_f$, the comparator 150 outputs a first signal level and if the amplified sensor signal $u_ä$ falls below the offset component $u_f$, the comparator outputs a second signal level being lower than the first signal level.

Summarized, in the simplest implementation, the offset component $u_f$ will be removed from the amplified sensor signal $u_ä$, by firstly detecting the offset component $u_f$ by the low-pass filter 130. Since a signal is a superposition of a plurality of single signal components, the offset component $u_f$ can then be removed by merely comparing the offset component $u_f$ against the amplified sensor signal $u_ä$.

Usually, the amplified sensor signal $u_ä$ further includes electronic noise components. These may be removed by applying a Schmitt-Trigger as comparator 150. To facilitate the understanding, a short explanation for the Schmitt-Trigger 150 should be provided hereinafter.

Figure 7:
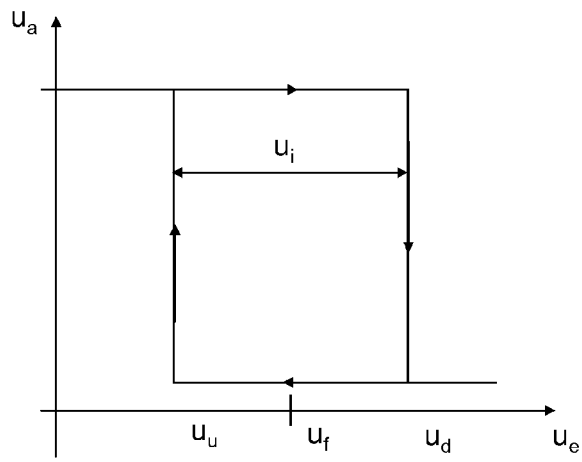
FIG. 7 is a diagram showing the working principle of a fifth embodiment of a comparator according to the invention.

FIG. 7 is a diagram explaining the operation of the Schmitt-Trigger 150 used in the present invention. A Schmitt-Trigger 150 is a comparator that includes two different signal thresholds depending on the slope of at least one input signal. In detail, if the input signal has a positive slope, the Schmitt-Trigger 150 uses the first signal threshold for the comparison. Synchronously, if the slope of the input signal is negative, the Schmitt-Trigger 150 uses the second signal threshold for comparison.

As can be seen from the FIG. 7, the Schmitt-Trigger 150 may define its threshold based on a hysteresis distance $u_i$. Based therein, two different hysteresis levels $u_d$, $u_u$ may be defined. The hysteresis distance $u_i$ may be supplied from the controller 140 to the Schmitt-Trigger 150. The controller 140 may define the hysteresis distance $u_i$ based on the expected magnitudes of the noise components to be removed from the measurement signal $u_m$. Therein, the hysteresis distance $u_i$ should be the double of the expected magnitudes. To further improve the sensing apparatus, the controller 140 may also define the hysteresis distance $u_i$ based on the amplification factor A used in the amplifier 120 to amplify the sensor signal $u_a$. This feature would facilitate the determination of the hysteresis distance $u_i$, since the amplifier 120 not only amplifies the interesting components of the sensor signal $u_a$ but also the noise components.

Having received the hysteresis distance $u_i$, the Schmitt-Trigger 150 defines an upper hysteresis $u_u$ and a lower hysteresis $u_d$. The upper hysteresis $u_u$ leads to a change in the level of the measurement signal $u_m$, if the amplified sensor signal $u_ä$ crosses the upper hysteresis $u_u$ from top to down. Synchronously, the lower hysteresis $u_d$ leads to a change in the level of the measurement signal $u_m$, if the amplified sensor signal $u_ä$ crosses the lower hysteresis $u_u$ from down to top.

Figure 8:
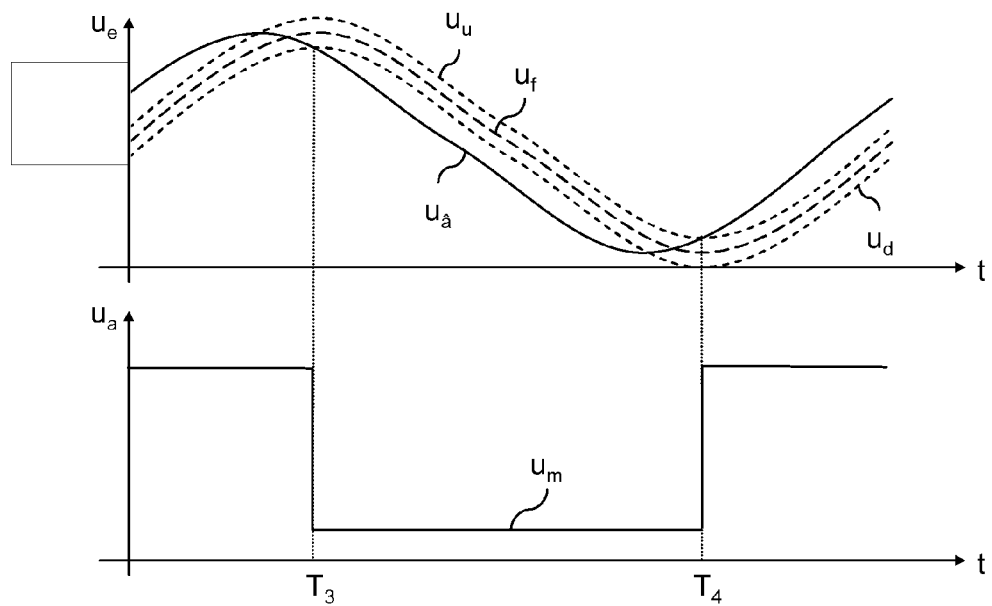
FIG. 8 is a circuit diagram of a first filter for implementing into the sensing apparatus of FIG. 1.

Summarized, the Schmitt-Trigger 150 is a comparator that removes noise components from the sensor signal ua by defining two different threshold levels. These threshold levels may be defined based on the expected magnitude of the noise components. FIG. 8 shows the working principle of a second embodiment of the comparator 150 if the comparator is a Schmitt-Trigger. Therein, the upper hysteresis $u_u$ and the lower hysteresis $u_d$ is defined as described above. As can be seen, both hysteresis levels $u_u$, $u_d$ are steadily defined newly, since the offset component $u_f$ is changing over the time.

As can be further seen from FIG. 8, the Schmitt Trigger only changes the signal level of the measurement signal $u_m$ if amplified sensor signal $u_ä$ crosses the upper hysteresis $u_u$ positively in the point $T_3$ or the lower hysteresis $u_d$ is crossed negatively in the point $T_4$. If the amplified sensor signal is situated between the upper hysteresis $u_u$ and the lower hysteresis $u_d$, the signal level of the measurement signal $u_m$ keeps unaltered.

Figure 9:
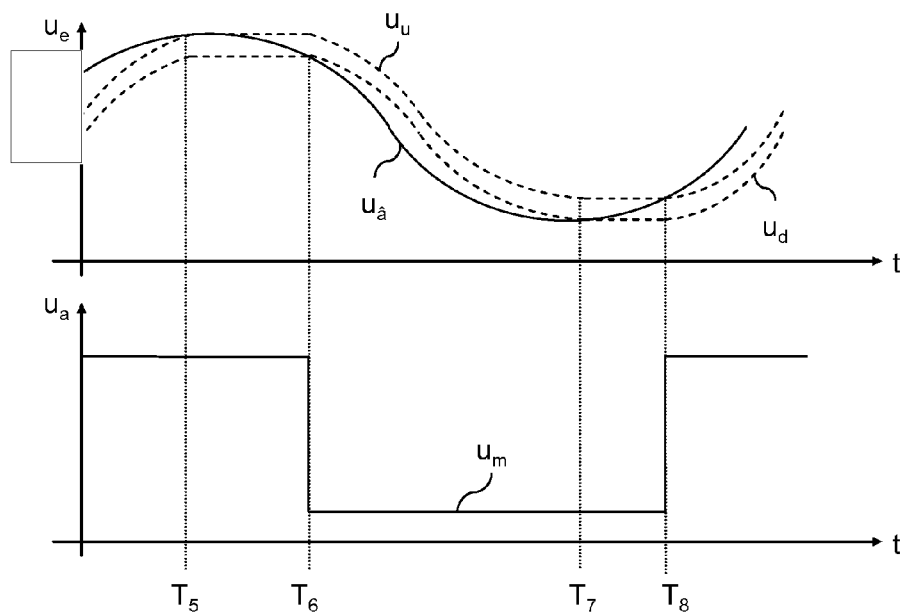
FIG. 9 is a circuit diagram of a second filter for implementing into the sensing apparatus of FIG. 1.

FIG. 9 shows the working principle of a third embodiment of the comparator 150 if the comparator is a Schmitt-Trigger. Therein, it is further considered, that the amplified sensor signal $u_ä$ may steadily run between the upper hysteresis $u_u$ and the lower hysteresis $u_d$. In this case, there would be no crossing points and thus no generation of the measurement signal $u_m$, since the measurement signal $u_m$ keeps unaltered, if it is situated between the upper hysteresis $u_u$ and the lower hysteresis $u_d$.

However, this situation can be prevented by keeping the hysteresis levels constant if the measurement signal $u_m$ is situated between the upper hysteresis $u_u$ and the lower hysteresis $u_d$. As can bee seen from FIG. 9, if the measurement signal $u_m$ negatively crosses the upper hysteresis level $u_u$ at the point $T_5$, the controller 140 will stop changing both hysteresis levels $u_u$, $u_d$ and keeps them constant. Since the amplified sensor signal $u_ä$ is alternating, it will forcibly cross the lower hysteresis level in point $T_6$. Synchronously, if the measurement signal $u_m$ positively crosses the lower hysteresis level $u_d$ at the point $T_7$, the controller 140 will keep both hysteresis levels $u_u$, $u_d$ constant. Therefore, the amplified sensor signal $u_ä$ will forcibly cross the upper hysteresis level $u_u$ in point $T_8$.

By forcing constant hysteresis levels $u_u$, $u_d$, when the amplified sensor signal $u_ä$ is situated between them, the sensor apparatus 100 prevents that the amplified sensor signal $u_ä$ will steadily run between the upper and lower hysteresis levels $u_u$, $u_d$ and therefore generate no measurement signal $u_m$.

The sensor head 110 may utilize an anisotropic magneto resistive sensor (AMR-sensor). This kind of sensor detects a local position based on a magnetic field and a changing electrical resistance. Therein, the electrical resistance may be detected by a Wheatstone bridge, as indicated in FIG. 1. Since the resistance of AMR-sensors periodically changes over the time and the Wheatstone bridge requires a constant current as offset component for its operation, the present invention is very suitable for these kinds of sensors. The present invention proposes a filter device, which filters a signal component from an input signal by periodically switching a connection between energy storages within the filter device. The present invention further proposes a processing device, which removes the filtered signal component from the input signal. This allows to separate unintended signal components from an input signal without distorting the interesting components.

The invention claimed is:

1. Filter device for filtering an input signal, comprising:
   a first energy storage element receiving the input signal;
   a second energy storage element connected to the first energy storage element; and
   a switching circuit for enabling and disabling a connection between the first and second energy storage elements, wherein the second energy storage element is adapted to output a filtered input signal including a constant component; and
   a comparator adapted to compare the input signal and the filtered output signal to indicate a deviation.

2. Filter device according to claim 1, further comprising a control device adapted to force the switching circuit to periodically enable and disable the connection with a predetermined switching frequency.

3. Signal processor for removing at least one unintended signal component from an input signal, comprising:
   a filter device for filtering the input signal and generating a filtered signal including the unintended signal component;
   a processing device for generating an output signal indicating a deviation of the input signal from the filtered signal including a constant component wherein the processing device includes a comparator that is adapted to compare the input signal and the filtered signal to determine the deviation.

4. Signal processor of claim 3, wherein the filter device is a low pass filter according to claim 1.

5. Signal processor of claim 3, wherein
   the first time window is a short time window and set in an initial state of the device, and
   the second time window is a long time window and set in a steady state of the device.

6. Signal processor according to claim 3, wherein the processing device is adapted to generate
   an upper hysteresis level higher than a level of the filtered input signal, and
   a lower hysteresis level lower than the level of the filtered input signal.

7. Signal processor of claim 6, wherein the processing device is adapted
   to output a first signal level if the input signal exceeds the upper hysteresis level,
   to output a second signal level if the input signal falls below the lower hysteresis level, and
   to keep its output unaltered, if the input signal is situated between the upper and lower hysteresis level.

8. Signal processor of claim 6, further comprising a control device for setting a distance between the upper and the lower hysteresis level.

9. Signal processor according to claim 6, further comprising a control device adapted to force the processing device to keep the upper and lower hysteresis level constant, if the input signal is situated between the upper and lower hysteresis level.

10. Sensor apparatus adapted to output an offset free measurement signal, comprising:
   a sensor head for generating a sensor signal based on a measured physical value, which is optionally an anisotropic magneto resistive sensor (AMR-sensor), and;
   a signal processor according to claim 3 for
   receiving the sensor signal, and
   outputting the measurement signal being the sensor signal with a removed constant component.

11. Sensor apparatus of claim 10, further comprising an amplifier for amplifying the sensor signal based on an amplification factor, wherein a distance between an upper and a lower hysteresis level in the signal processor is set based on the amplification factor, wherein the amplification factor of the amplifier is optionally controlled by an automatic gain control.

12. Method for removing a constant component from an input signal including:
   charging an energy storage element with the input signal to generate a filtered signal including the constant component;
   comparing the filtered signal with the input signal using a comparator; and
   generating an output signal indicating a deviation of the input signal from the filtered signal.

13. Filter device according to claim 1, further comprising:
   a first switch at a first of the two connection lines between the first capacitor and the second capacitor; and
   a second switch at a second of the two connection lines between the first capacitor and the second capacitor.

14. Method according to claim 12, wherein the constant component is an offset component of the input signal.

15. The signal processor of claim 3, wherein the filter device is adapted to determine an average signal of the input signal during a time window, wherein the time window is set by a control device and wherein the control device is a state machine adapted to switch into a first state for setting a first time window, and to switch into a second state for setting a second time window.

* * * * *